(12) United States Patent
Brox et al.

(10) Patent No.: US 12,353,736 B2
(45) Date of Patent: Jul. 8, 2025

(54) TEMPERATURE-DEPENDENT REFRESH OPERATIONS

(71) Applicant: Micron Technology, Inc., Boise, ID (US)

(72) Inventors: Martin Brox, Munich (DE); Elena Cabrera Bernal, Munich (DE); Milena Tsvetkova Ivanov, Munich (DE); Manfred Hans Plan, Munich (DE); Oleg Sakolski, Munich (DE); Filippo Vitale, Dachau (DE)

(73) Assignee: Micron Technology, Inc., Boise, ID (US)

( * ) Notice: Subject to any disclaimer, the term of this patent is extended or adjusted under 35 U.S.C. 154(b) by 1 day.

(21) Appl. No.: 17/884,278

(22) Filed: Aug. 9, 2022

(65) Prior Publication Data

US 2024/0053908 A1 Feb. 15, 2024

(51) Int. Cl.
*G06F 3/06* (2006.01)
(52) U.S. Cl.
CPC .......... *G06F 3/0632* (2013.01); *G06F 3/0604* (2013.01); *G06F 3/0679* (2013.01)
(58) Field of Classification Search
None
See application file for complete search history.

(56) References Cited

U.S. PATENT DOCUMENTS

| | | | | |
|---|---|---|---|---|
| 6,731,558 B2* | 5/2004 | Yamauchi | ................ | G11C 7/04 365/222 |
| 7,471,136 B2* | 12/2008 | Hong | .................... | G11C 11/406 327/513 |
| 8,027,216 B2* | 9/2011 | Fukuda | ............. | G11C 11/40615 365/236 |
| 8,028,198 B2* | 9/2011 | Resnick | ............... | G11C 7/1006 714/42 |
| 8,462,560 B2* | 6/2013 | Furutani | ........... | G11C 11/40615 365/236 |
| 9,658,795 B2* | 5/2017 | Jayaraman | ............... | G06F 1/206 |
| 9,978,430 B2* | 5/2018 | Seo | .................... | G11C 11/40611 |
| 2009/0052268 A1* | 2/2009 | Janzen | ...................... | G01K 7/00 365/230.02 |
| 2017/0295339 A1* | 10/2017 | Ibaraki | ................. | H04N 23/667 |
| 2020/0402568 A1* | 12/2020 | He | .................... | G11C 11/40626 |

* cited by examiner

*Primary Examiner* — Elias Mamo
(74) *Attorney, Agent, or Firm* — Holland & Hart LLP

(57) ABSTRACT

Methods, systems, and devices for temperature-dependent refresh operations are described. A memory system may adjust refresh operations based on a temperature of the memory system to reduce a refresh current and improve reliability of the refresh operations. For example, the memory system may include a temperature sensor configured to provide temperature information associated with a memory device. Based on the temperature information, the memory system may, in response to a refresh command, activate a set of access lines (e.g., word lines) to refresh memory cells coupled with the access lines, where a count of the set of access lines (e.g., how many access lines are included in the set) may be based on the temperature information. In some examples, the count of the set may be determined based on comparing the temperature information to one or more temperature thresholds.

23 Claims, 6 Drawing Sheets

TEMPERATURE-DEPENDENT REFRESH OPERATIONS

FIELD OF TECHNOLOGY

The following relates to one or more systems for memory, including temperature-dependent refresh operations.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not- or (NOR) and not- and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Some memory systems, such as volatile memory systems (e.g., memory systems that include volatile memory cells, such as dynamic random access memory (DRAM) memory cells) may experience performance issues due to varying conditions. For example, in a DRAM memory cell, a charge stored in a capacitor at the memory cell may leak over time, which may impact reliability of reading data associated with the charge stored in the capacitor. To preserve information stored in the memory cell, a memory system may periodically perform one or more refresh operations on the memory cell, where the memory cell may be read and written without substantial modification of a value of the charge to be stored, to refresh the charge stored in the capacitor at the memory cell. In some cases, however, components associated with refresh operation may have reduced performance at temperatures outside a typical operating range (e.g., lower temperatures), and performing refresh operations may reduce the overall reliability and performance of the memory system at temperatures outside the typical operating range (e.g., lower temperatures).

As described herein, a memory system may adjust one or more aspects related to one or more refresh operations based on a temperature of the memory system. For example, the memory system may include a temperature sensor configured to provide temperature information associated with a memory device (e.g., a temperature of the memory device in ° C. or ° F.). Based on the temperature information, the memory system may, in response to a command such as a refresh command, activate a set of access lines (e.g., word lines) to refresh memory cells coupled with the access lines, where a count of the set of access lines (e.g., how many access lines are included in the set, such as one, two, or four access lines) may be based on the temperature information. In some examples, the count of the set may be determined based on comparing the temperature information to one or more temperature thresholds. Implementing a temperature-dependent refresh scheme enables a memory device to reduce a refresh current and improve reliability of the refresh operations, among other benefits.

Features of the disclosure are initially described in the context of systems and dies as described with reference to FIGS. 1 and 2. Features of the disclosure are described in the context of temperature schemes as described with reference to FIGS. 3 and 4. These and other features of the disclosure are further illustrated by and described with reference to an apparatus diagram and flowcharts that relate to temperature-dependent refresh operations as described with reference to FIGS. 5 and 6.

Figure 1:
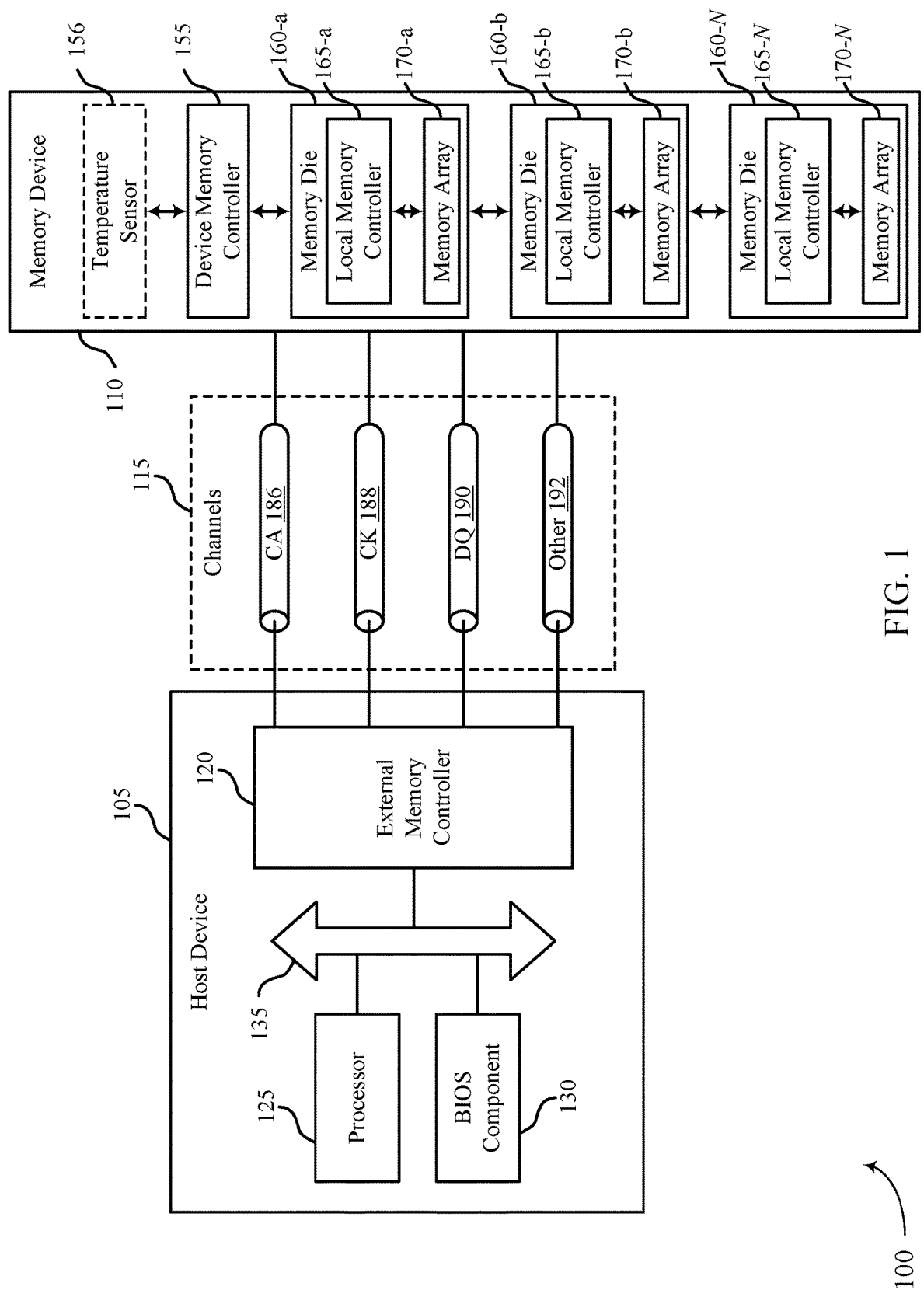
FIG. 1 illustrates an example of a system that supports temperature-dependent refresh operations in accordance with examples as disclosed herein.

FIG. 1 illustrates an example of a system 100 that supports temperature-dependent refresh operations in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

The device memory controller 155 may include components (e.g., circuitry, logic) operable to control operation of the memory device 110. The device memory controller 155 may include hardware, firmware, or instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may communicate information (e.g., data, commands, or both) with the host device 105. For example, the memory device 110 may receive a write command indicating that the memory device 110 is to store data received from the host device 105, or receive a read command indicating that the memory device 110 is to provide data stored in a memory die 160 to the host device 105, among other types of information communication.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100

(e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a refresh command. In some examples, a CA channel 186 may include any quantity of signal paths (e.g., eight or nine signal paths) to communicate control information (e.g., commands or addresses).

In some examples, the memory device 110 may include a temperature sensor 156. The temperature sensor 156 may be configured to measure a temperature of the memory device 110. In some examples, the temperature sensor 156 may be coupled with the device memory controller 155 and provide temperature information associated with the memory device 110. As described herein, the memory system 100 may adjust refresh operations based on the temperature of the memory device 110 to reduce a refresh current and improve reliability of the refresh operations. For example, based on the temperature information provided by the temperature sensor 156, the memory device 110 may, in response to a refresh command (e.g., from the host device 105), activate a set of access lines (e.g., word lines) to refresh memory cells coupled with the access lines, where a count of the set of access lines (e.g., how many access lines are included in the set, such as one, two, or four access lines) may be based on the temperature information. In some examples, the count of the set may be determined based on comparing the temperature information to one or more temperature thresholds.

Figure 2:
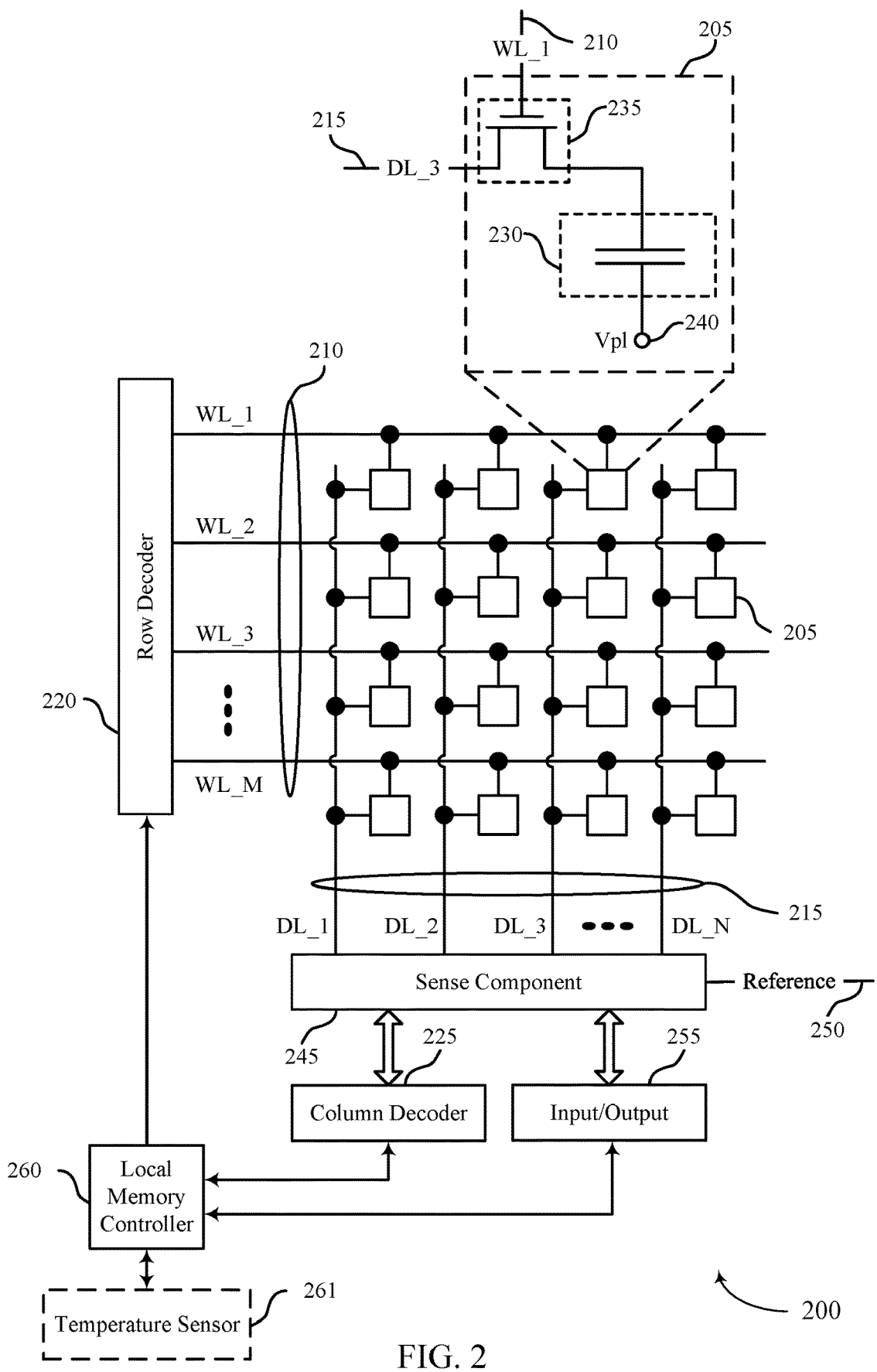
FIG. 2 illustrates an example of a memory die that supports temperature-dependent refresh operations in accordance with examples as disclosed herein.

FIG. 2 illustrates an example of a memory die 200 that supports temperature-dependent refresh operations in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235 (e.g., a cell selection component). The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include access lines (e.g., word lines 210, digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding. Memory cells 205 may be positioned at intersections of the word lines 210 and the digit lines 215.

Operations such as reading and writing may be performed on the memory cells 205 by activating access lines such as a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in a two-dimensional or in a three-dimensional configuration may be referred to as an address of a memory cell 205. Activating a word line 210 or a digit line 215 may include applying a voltage to the respective line.

Accessing the memory cells 205 may be controlled through a row decoder 220, or a column decoder 225, or any combination thereof. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

A word line 210 may be a conductive line in electronic communication with a memory cell 205 that is used to perform access operations on the memory cell 205. In some architectures, the word line 210 may be coupled with a gate of a switching component 235 of a memory cell 205 and may be operable to control the switching component 235 of the memory cell. In some architectures, the word line 210 may be coupled with a node of the capacitor of the memory cell 205 and the memory cell 205 may not include a switching component.

A digit line 215 may be a conductive line that couples the memory cell 205 with a sense component 245. In some architectures, the memory cell 205 may be selectively coupled with the digit line 215 during portions of an access operation. For example, the word line 210 and the switching component 235 of the memory cell 205 may be operable to couple or isolate the capacitor 230 of the memory cell 205 and the digit line 215. In some architectures, the memory cell 205 may be coupled with the digit line 215.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device (e.g., a memory device 110) that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 260 may generate row signals and column address signals to activate the target word line 210 and the target digit line 215. The local memory controller 260 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired state (e.g., logic state, charge state). The local memory controller 260 may identify a target memory cell 205 on which to perform the write operation. The local memory controller 260 may identify a target word line 210 and a target digit line 215 coupled with the target memory cell 205 (e.g., an address of the target memory cell 205). The local memory controller 260 may activate the target word line 210 and the target digit line 215 (e.g., applying a voltage to the word line 210 or digit line 215) to access the target memory cell 205. The local memory controller 260 may apply a signal (e.g., a write pulse, a write voltage) to the digit line 215 during the write operation to store a specific state (e.g., charge) in the capacitor 230 of the memory cell 205. The signal used as part of the write operation may include one or more voltage levels over a duration.

The local memory controller 260 may be operable to perform a read operation (e.g., a sense operation) on one or more memory cells 205 of the memory die 200. During a read operation, the state (e.g., logic state, charge state) stored in a memory cell 205 of the memory die 200 may be evaluated (e.g., read, determined, identified). The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal (e.g., charge, voltage) to the sense component 245 in response to biasing the access lines. The sense component 245 may amplify the signal. The local memory controller 260 may activate the sense component 245 (e.g., latch the sense component) and compare the signal received from the memory cell 205 to a reference (e.g., the reference 250). Based on that comparison, the sense component 245 may determine a logic state that is stored on the memory cell 205.

In some examples, the memory die 200 may include a temperature sensor 261. The temperature sensor 261 may be configured to measure a temperature of the memory die 200. In some examples, the temperature sensor 156 may be coupled with the local memory controller 260 and provide temperature information associated with the memory die 200. As described herein, the memory die 200 may adjust refresh operations based on the temperature of the memory die 200 to reduce a refresh current and improve reliability of the refresh operations. For example, based on the temperature information provided by the temperature sensor 261, the memory die 200 may, in response to a refresh command, activate a set of access lines (e.g., word lines 210) to refresh memory cells 205 coupled with the access lines, where a count of the set of access lines (e.g., how many access lines are included in the set, such as one, two, or four access lines) may be based on the temperature information. In some examples, the count of the set may be determined based on comparing the temperature information to one or more temperature thresholds.

Figure 3:
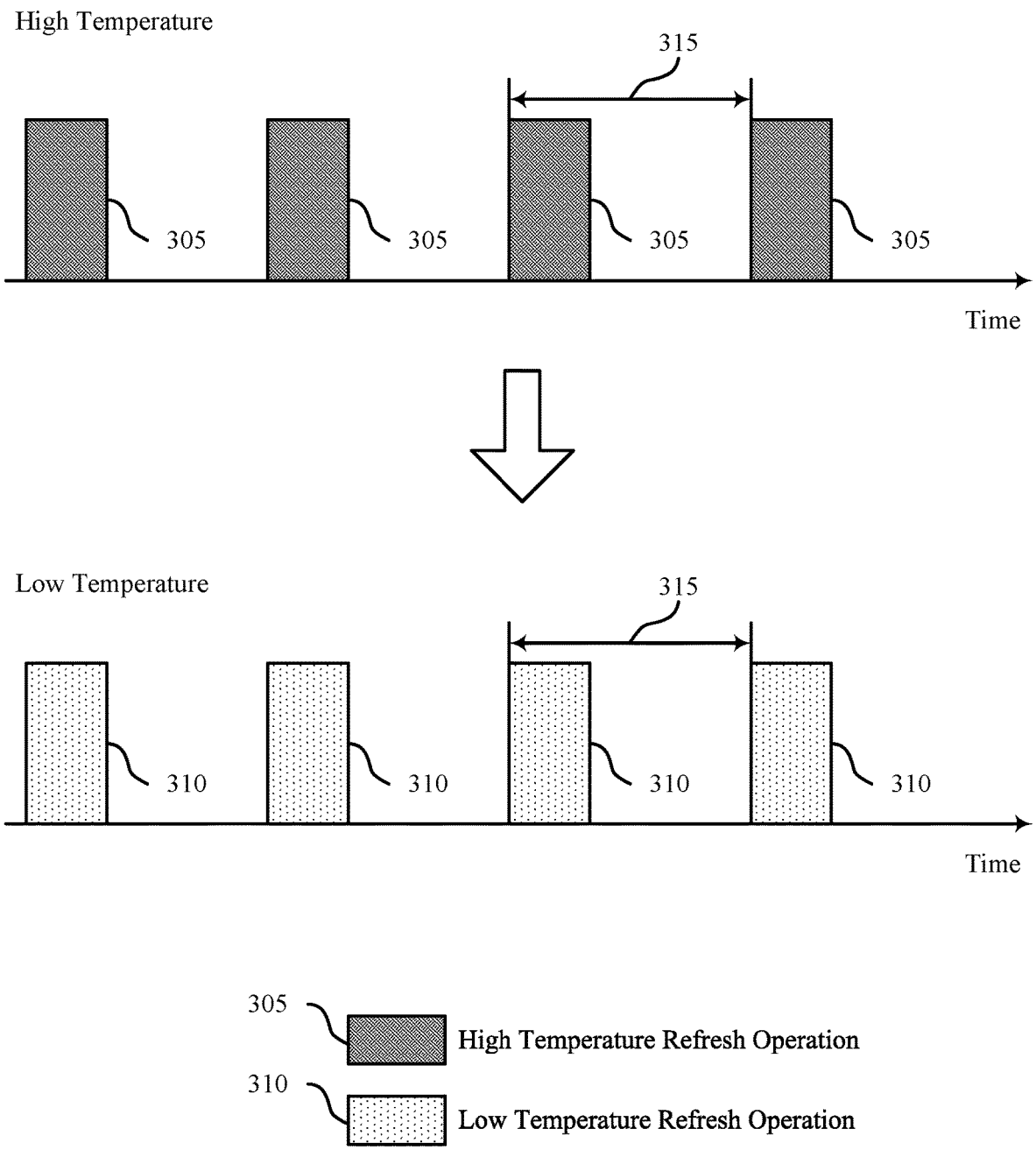
FIG. 3 illustrates an example of a temperature scheme that supports temperature-dependent refresh operations in accordance with examples as disclosed herein.

FIG. 3 illustrates an example of a temperature scheme 300 that supports temperature-dependent refresh operations in accordance with examples as disclosed herein. In some examples, the temperature scheme 300 may be implemented at a memory device, which may be an example of a memory device described with reference to FIGS. 1 and 2.

The memory device implementing the temperature scheme 300 may include one or more components whose performance is dependent on a temperature of the memory device. For example, a threshold voltage of a complementary metal-oxide-semiconductor (CMOS) circuit (e.g., a CMOS transistor) may increase as the temperature decreases. Additionally, or alternatively, performance of a DRAM core (e.g., a memory array, a sense component, or both, as described with reference to FIG. 2) may be reduced at low temperatures (e.g., −40° C., such as in an automotive application). In some cases, mechanisms associated with leakage of a charge at a memory cell of the memory device (e.g., charge leakage which may be corrected using refresh operations) may be reduced at low temperatures, and so the quantity of refresh operations may be reduced at lower temperatures without impacting reliability of reading data stored in memory cells.

As described herein, the memory device may perform one or more refresh operations according to the temperature scheme 300, for example, to improve a refresh current and reliability of the refresh operations. For example, the memory system may include one or more temperature sensors configured to provide temperature information associated with a memory system, for example, temperature information associated with a memory device (e.g., the temperature of the memory device, one or more temperatures associated with one or more respective components of the memory system).

In some examples, the temperature information may indicate that the temperature of the memory device is a high temperature (e.g., 100° C., or above a temperature threshold), and the memory device may accordingly perform high temperature refresh operations 305 according to a first periodicity 315. In one example, the memory device may perform a high temperature refresh operation 305 that includes refreshing a quantity of word lines with a given periodicity 315, such as 4 word lines with the first periodicity 315 of 2 microseconds (μs). In some examples, the memory device may activate the word lines using a driver (e.g., a row decoder described with reference to FIG. 2).

In some examples, the temperature information may indicate that the temperature of the memory device (or another component of a memory system) is a low temperature (e.g., 30° C., or below a temperature threshold), and the memory device may accordingly perform low temperature refresh operations 310 according to a second periodicity 315. In some examples, the memory device may perform a low temperature refresh operation 305 that includes refreshing a quantity of word lines with a second periodicity 315, such as 1 word line with the second periodicity 315 of 2 microseconds (μs). That is, the memory device may perform high temperature refresh operations 305 and low temperature refresh operations 310 according to the same periodicity 315.

Figure 4:
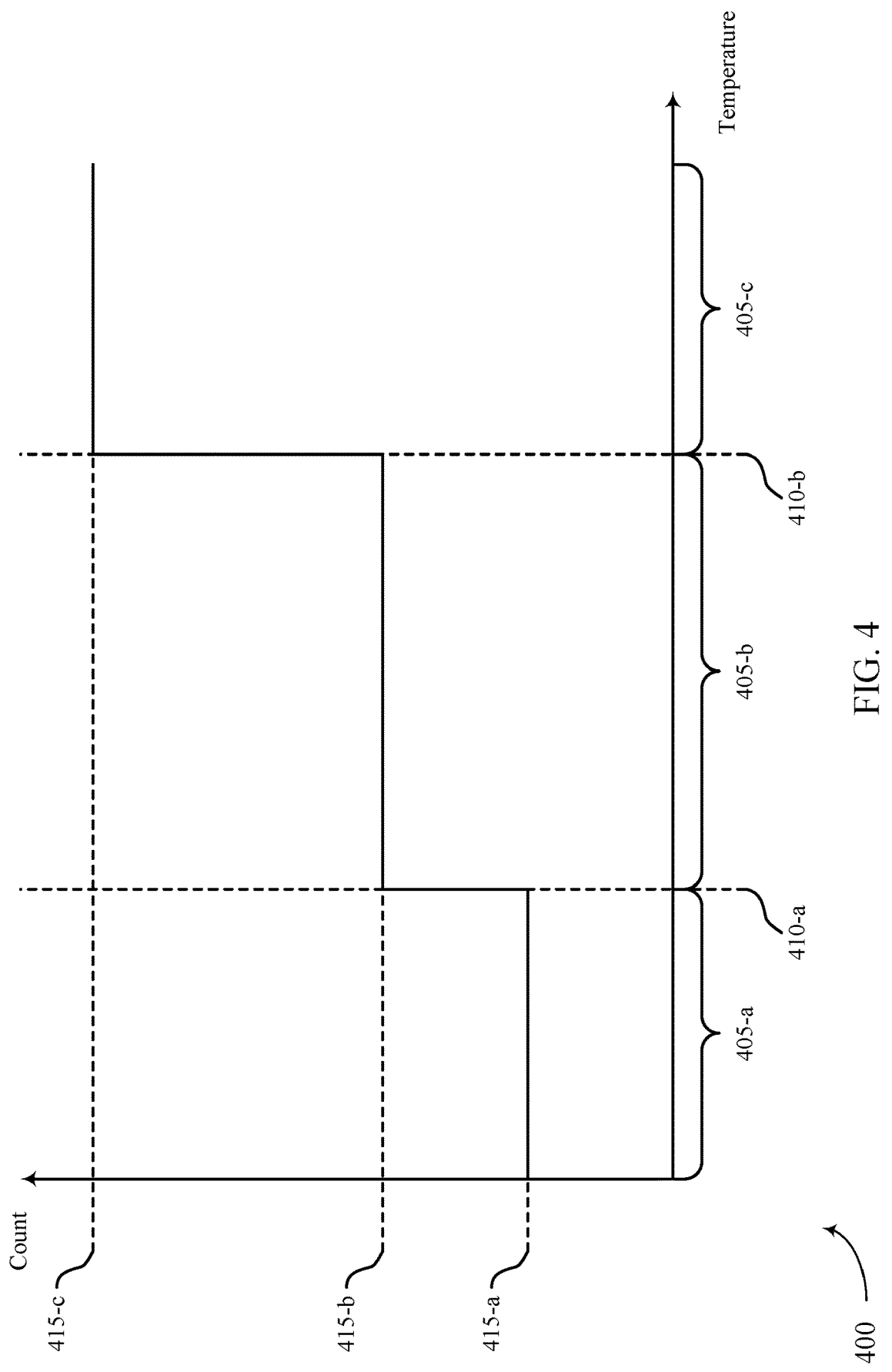
FIG. 4 illustrates an example of a temperature scheme that supports temperature-dependent refresh operations in accordance with examples as disclosed herein.

FIG. 4 illustrates an example of a temperature scheme 400 that supports temperature-dependent refresh operations in accordance with examples as disclosed herein. In some examples, the temperature scheme 400 may be implemented at a memory device, which may be an example of a memory device described with reference to FIGS. 1 and 2.

As described herein, the memory device may perform refresh operations according to the temperature scheme 400, for example, to improve a refresh current and reliability of the refresh operations, among other benefits. For example, the memory system may include a temperature sensor configured to provide temperature information associated with a memory device (e.g., the temperature of the memory device), another component of the memory system, or any combination thereof.

The temperature scheme 400 depicts a count 415 of access lines activated in each refresh operation performed at the memory device as a function of a temperature of the memory device. For example, if the temperature information indicates the temperature of the memory device is within a temperature range 405-a (e.g., 30° C., or a temperature that is less than a temperature threshold 410-a), the memory device may be configured to activate a count 415-a of access lines (e.g., 1 access line, such as a word line) in each refresh operation (e.g., in respond to a refresh command, such as from a host device). If the temperature information indicates the temperature of the memory device is within a temperature range 405-b (e.g., 50° C., or a temperature that is different than, such as greater than, the temperature threshold 410-a and different than, such as less than, a temperature threshold 410-b), the memory device may be configured to activate a count 415-b of access lines (e.g., 2 access lines) in each refresh operation. If the temperature information indicates the temperature of the memory device is within a temperature range 405-c (e.g., 100° C., or a temperature that is different than, such as greater than the temperature threshold 410-b), the memory device may be configured to activate a count 415-c of access lines (e.g., 4 access lines) in each refresh operation. In some examples, the temperature ranges 405-a, 405-b, and 405-c may be referred to as a "cold" range, an "intermediate" range, and a "hot" range, respectively.

In some examples, the memory device may determine the count 415 based on comparing a value in the temperature information (e.g., the temperature of the memory device in ° C. or ° F.) to the temperature thresholds 410 to identify the corresponding temperature range 405. The memory device may adjust the count 415 in response to updated temperature information, such as temperature information that indicates the temperature of the memory device is within a different temperature range 405. In some examples, the count 415 may be per region (e.g., per bank) of an array at the memory device. In some examples, the memory device may activate access lines according to the temperature dependent count 415 in response to one or more access commands (e.g., one or more read commands, one or more write commands, one or more program commands, or any combination thereof).

In some examples, the memory device may perform error correction as part of a refresh operation to periodically perform error correction on each portion of the memory device. For example, the memory device may include an error correction code (ECC) block that stores parity bits for detecting errors. The ECC block may perform error correction on data stored in a memory cell or a group of memory cells (e.g., a row of memory cells coupled with a word line) as part of reading data from or writing the data back to the memory cell or group of memory cells as part of the refresh operation.

Figure 5:
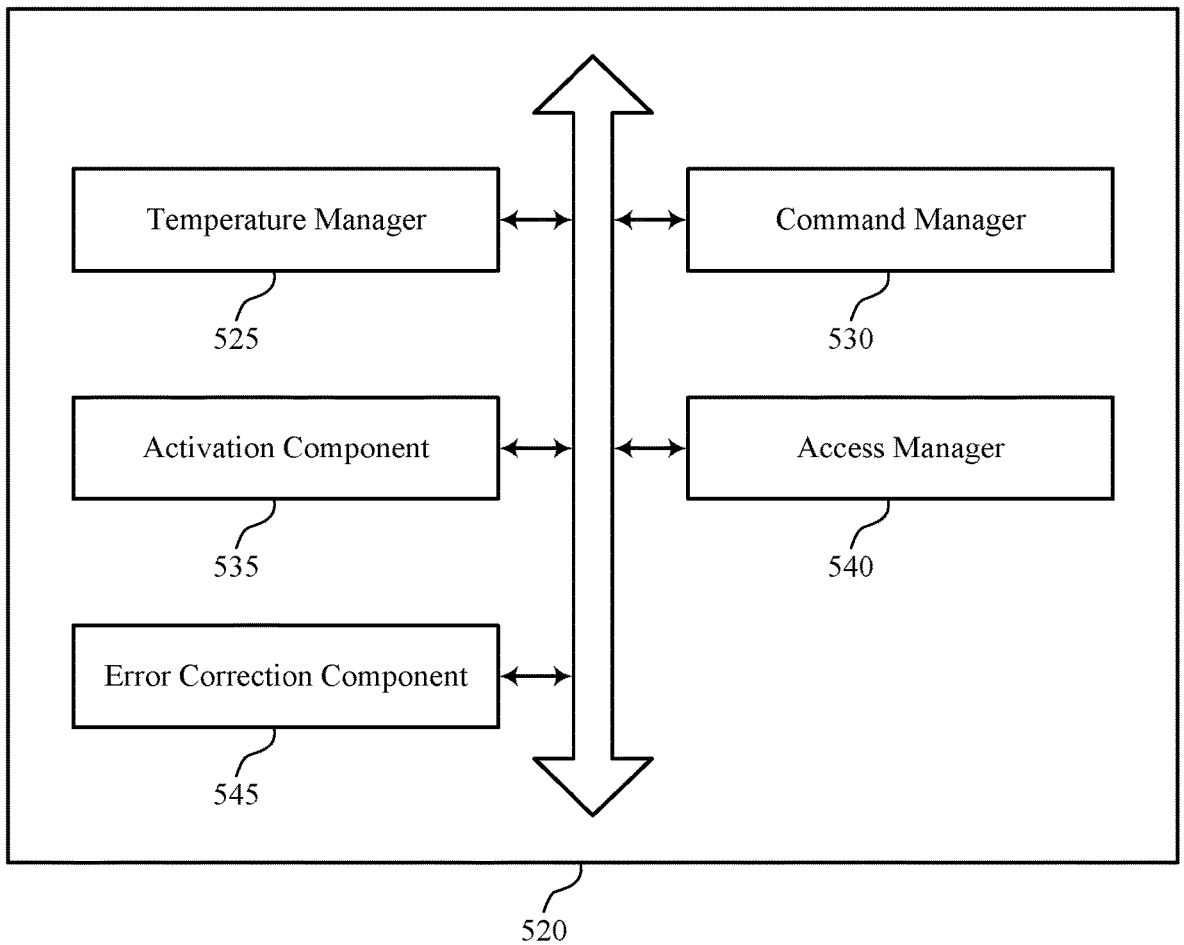
FIG. 5 shows a block diagram of a memory device that supports temperature-dependent refresh operations in accordance with examples as disclosed herein.

FIG. 5 shows a block diagram 500 of a memory device 520 that supports temperature-dependent refresh operations in accordance with examples as disclosed herein. The memory device 520 may be an example of aspects of a memory device as described with reference to FIGS. 1 through 4. The memory device 520, or various components thereof, may be an example of means for performing various aspects of temperature-dependent refresh operations as described herein. For example, the memory device 520 may include a temperature manager 525, a command manager 530, an activation component 535, an access manager 540, an error correction component 545, or any combination thereof. Each of these components may communicate, directly or indirectly, with one another (e.g., via one or more buses).

The temperature manager 525 may be configured as or otherwise support a means for receiving temperature information associated with a memory device. The command manager 530 may be configured as or otherwise support a means for receiving a refresh command at the memory device. The activation component 535 may be configured as or otherwise support a means for activating, in response to the refresh command, a set of one or more access lines, a count of the set of one or more access lines based at least in part on the temperature information.

In some examples, the temperature manager 525 may be configured as or otherwise support a means for comparing a value in the temperature information to a temperature threshold. In some examples, the activation component 535 may be configured as or otherwise support a means for determining the count of the set of one or more access lines based at least in part on comparing the value in the temperature information to the temperature threshold, where activating the set of one or more access lines is based at least in part on determining the count.

In some examples, the temperature manager 525 may be configured as or otherwise support a means for comparing the value in the temperature information to a second temperature threshold, where the count of the set of one or more access lines is further based at least in part on comparing the value in the temperature information to the second temperature threshold.

In some examples, the temperature threshold corresponds to a first temperature. In some examples, the second temperature threshold corresponds to a second temperature that is greater or less than the first temperature.

In some examples, the command manager 530 may be configured as or otherwise support a means for receiving an activation command at the memory device. In some examples, the activation component 535 may be configured as or otherwise support a means for activating, in response to the activation command, a second set of one or more access lines, a second count of the second set of one or more access lines based at least in part on the temperature information.

In some examples, the temperature manager 525 may be configured as or otherwise support a means for receiving, after activating the set of one or more access lines, second temperature information associated with the memory device. In some examples, the command manager 530 may be configured as or otherwise support a means for receiving a second refresh command at the memory device. In some examples, the activation component 535 may be configured as or otherwise support a means for activating, in response to the second refresh command, a second set of one or more access lines, a second count of the second set of one or more access lines based at least in part on the temperature information.

In some examples, a first value in the temperature information is greater than a second value in the second temperature information. In some examples, the second count is greater than the count.

In some examples, a first value in the temperature information is less than a second value in the second temperature information. In some examples, the second count is less than the count.

In some examples, the set of one or more access lines and the second set of one or more access lines are activated according to a same activation periodicity.

In some examples, the activation component 535 may be configured as or otherwise support a means for routing current from a driver to the set of one or more access lines in response to the refresh command, where activating the activating the set of one or more access lines is based at least in part on the routed current.

In some examples, a magnitude of the routed current is based at least in part on the temperature information.

In some examples, the access manager 540 may be configured as or otherwise support a means for accessing a set of one or more rows of memory cells within a memory array based at least in part on activating the set of one or more access lines, where each row of the set of one or more rows is coupled with a respective access line of the set of one or more access lines.

In some examples, the error correction component 545 may be configured as or otherwise support a means for determining whether the row includes a data error based at least in part on accessing the row. In some examples, the error correction component 545 may be configured as or otherwise support a means for correcting the data error using an error correction procedure based at least in part on determining that the row includes the data error.

In some examples, the temperature information includes a value that corresponds to a temperature of one or more components at the memory device.

In some examples, the set of one or more access lines includes one or more word lines.

Figure 6:
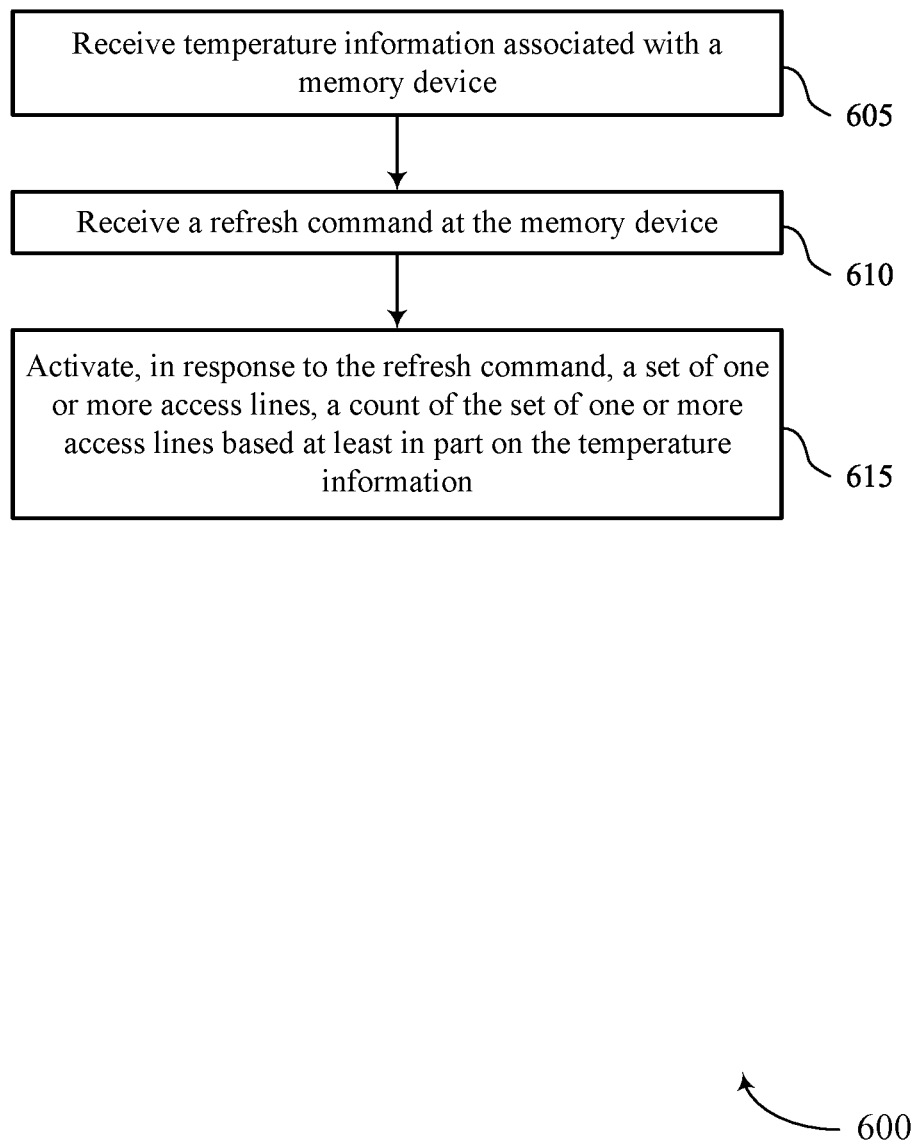
FIG. 6 shows a flowchart illustrating a method or methods that support temperature-dependent refresh operations in accordance with examples as disclosed herein.

FIG. 6 shows a flowchart illustrating a method 600 that supports temperature-dependent refresh operations in accordance with examples as disclosed herein. The operations of method 600 may be implemented by a memory device or its components as described herein. For example, the operations of method 600 may be performed by a memory device as described with reference to FIGS. 1 through 5. In some examples, a memory device may execute a set of instructions to control the functional elements of the device to perform the described functions. Additionally, or alternatively, the memory device may perform aspects of the described functions using special-purpose hardware.

At 605, the method may include receiving temperature information associated with a memory device. The operations of 605 may be performed in accordance with examples as disclosed herein. In some examples, aspects of the operations of 605 may be performed by a temperature manager 525 as described with reference to FIG. 5.

At 610, the method may include receiving a refresh command at the memory device. The operations of 610 may be performed in accordance with examples as disclosed herein. In some examples, aspects of the operations of 610 may be performed by a command manager 530 as described with reference to FIG. 5.

At 615, the method may include activating, in response to the refresh command, a set of one or more access lines, a count of the set of one or more access lines based at least in part on the temperature information. The operations of 615 may be performed in accordance with examples as disclosed herein. In some examples, aspects of the operations of 615 may be performed by an activation component 535 as described with reference to FIG. 5.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving temperature information associated with a memory device; receiving a refresh command at the memory device; and activating, in response to the refresh command, a set of one or more access lines, a count of the set of one or more access lines based at least in part on the temperature information.

Aspect 2: The method, apparatus, or non-transitory computer-readable medium of aspect 1, further including operations, features, circuitry, logic, means, or instructions, or any combination thereof for comparing a value in the temperature information to a temperature threshold and determining the count of the set of one or more access lines based at least in part on comparing the value in the temperature information to the temperature threshold, where activating the set of one or more access lines is based at least in part on determining the count.

Aspect 3: The method, apparatus, or non-transitory computer-readable medium of aspect 2, further including operations, features, circuitry, logic, means, or instructions, or any combination thereof for comparing the value in the temperature information to a second temperature threshold, where the count of the set of one or more access lines is further based at least in part on comparing the value in the temperature information to the second temperature threshold.

Aspect 4: The method, apparatus, or non-transitory computer-readable medium of aspect 3, where the temperature threshold corresponds to a first temperature and the second temperature threshold corresponds to a second temperature that is greater or less than the first temperature.

Aspect 5: The method, apparatus, or non-transitory computer-readable medium of any of aspects 1 through 4, further including operations, features, circuitry, logic, means, or instructions, or any combination thereof for receiving an activation command at the memory device and activating, in response to the activation command, a second set of one or more access lines, a second count of the second set of one or more access lines based at least in part on the temperature information.

Aspect 6: The method, apparatus, or non-transitory computer-readable medium of any of aspects 1 through 5, further including operations, features, circuitry, logic, means, or instructions, or any combination thereof for receiving, after activating the set of one or more access lines, second temperature information associated with the memory device; receiving a second refresh command at the memory device; and activating, in response to the second refresh command, a second set of one or more access lines, a second count of the second set of one or more access lines based at least in part on the temperature information.

Aspect 7: The method, apparatus, or non-transitory computer-readable medium of aspect 6, where a first value in the temperature information is greater than a second value in the second temperature information and the second count is greater than the count.

Aspect 8: The method, apparatus, or non-transitory computer-readable medium of any of aspects 6 through 7, where a first value in the temperature information is less than a second value in the second temperature information and the second count is less than the count.

Aspect 9: The method, apparatus, or non-transitory computer-readable medium of any of aspects 6 through 8, where the set of one or more access lines and the second set of one or more access lines are activated according to a same activation periodicity.

Aspect 10: The method, apparatus, or non-transitory computer-readable medium of any of aspects 1 through 9, further including operations, features, circuitry, logic, means, or instructions, or any combination thereof for routing current from a driver to the set of one or more access lines in response to the refresh command, where activating the activating the set of one or more access lines is based at least in part on the routed current.

Aspect 11: The method, apparatus, or non-transitory computer-readable medium of aspect 10, where a magnitude of the routed current is based at least in part on the temperature information.

Aspect 12: The method, apparatus, or non-transitory computer-readable medium of any of aspects 1 through 11, further including operations, features, circuitry, logic, means, or instructions, or any combination thereof for accessing a set of one or more rows of memory cells within a memory array based at least in part on activating the set of one or more access lines, where each row of the set of one or more rows is coupled with a respective access line of the set of one or more access lines.

Aspect 13: The method, apparatus, or non-transitory computer-readable medium of aspect 12, further including operations, features, circuitry, logic, means, or instructions, or any combination thereof for determining whether the row includes a data error based at least in part on accessing the row and correcting the data error using an error correction procedure based at least in part on determining that the row includes the data error.

Aspect 14: The method, apparatus, or non-transitory computer-readable medium of any of aspects 1 through 13, where the temperature information includes a value that corresponds to a temperature of one or more components at the memory device.

Aspect 15: The method, apparatus, or non-transitory computer-readable medium of any of aspects 1 through 14, where the set of one or more access lines includes one or more word lines.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 16: An apparatus, including: a controller configured to receive a refresh command at a memory device; a temperature component coupled with the controller and configured to provide temperature information associated with the memory device; and a driver coupled with the controller and configured to activate, in response to the refresh command, a set of one or more access lines, a count of the set of one or more access lines based at least in part on the temperature information from the temperature component.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current, voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   receiving temperature information associated with one or more memory devices;
   receiving a refresh command at the one or more memory devices;
   routing, in response to the refresh command, a current from a driver to a set of one or more access lines in response to the refresh command; and
   activating, based at least in part on routing the current, the set of one or more access lines as part of one or more refresh operations, wherein a count indicative of a quantity of access lines in the set of one or more access lines is based at least in part on the temperature information.

2. The method of claim 1, further comprising:
   comparing a value in the temperature information to a temperature threshold; and
   determining the count indicative of the quantity of access lines in the set of one or more access lines based at least in part on comparing the value in the temperature information to the temperature threshold, wherein activating the set of one or more access lines is based at least in part on determining the count.

3. The method of claim 2, further comprising:
   comparing the value in the temperature information to a second temperature threshold, wherein the count indicative of the quantity of access lines in the set of one or more access lines is further based at least in part on comparing the value in the temperature information to the second temperature threshold.

4. The method of claim 3, wherein:
   the temperature threshold corresponds to a first temperature; and
   the second temperature threshold corresponds to a second temperature that is greater or less than the first temperature.

5. The method of claim 1, further comprising:
   receiving an activation command at the one or more memory devices; and
   activating, in response to the activation command, a second set of one or more access lines, wherein a second count indicative of a second quantity of access lines in the second set of one or more access lines is based at least in part on the temperature information.

6. The method of claim 1, further comprising:
   receiving, after activating the set of one or more access lines, second temperature information associated with the one or more memory devices;
   receiving a second refresh command at the one or more memory devices; and
   activating, in response to the second refresh command, a second set of one or more access lines, wherein a second count indicative of a second quantity of access lines in the second set of one or more access lines is based at least in part on the second temperature information.

7. The method of claim 6, wherein:
a first value in the temperature information is greater than a second value in the second temperature information; and
the second count is greater than the count.

8. The method of claim 6, wherein:
a first value in the temperature information is less than a second value in the second temperature information; and
the second count is less than the count.

9. The method of claim 6, wherein the set of one or more access lines and the second set of one or more access lines are activated according to a same activation periodicity.

10. The method of claim 1, wherein a magnitude of the routed current is based at least in part on the temperature information.

11. The method of claim 1, further comprising:
accessing a set of one or more rows of memory cells within a memory array based at least in part on activating the set of one or more access lines, wherein each row of the set of one or more rows is coupled with a respective access line of the set of one or more access lines.

12. A method, comprising:
receiving temperature information associated with one or more memory devices;
receiving a refresh command at the one or more memory devices;
activating, in response to the refresh command, a set of one or more access lines as part of one or more refresh operations, wherein a count indicative of a quantity of access lines in the set of one or more access lines is based at least in part on the temperature information;
accessing a set of one or more rows of memory cells within a memory array based at least in part on activating the set of one or more access lines, wherein each row of the set of one or more rows is coupled with a respective access line of the set of one or more access lines;
determining whether a row of the set of one or more rows includes a data error based at least in part on accessing the row; and
correcting the data error using an error correction procedure based at least in part on determining that the row includes the data error.

13. The method of claim 1, wherein the temperature information comprises a value that corresponds to a temperature of one or more components at the one or more memory devices.

14. The method of claim 1, wherein the set of one or more access lines comprises one or more word lines.

15. A memory system, comprising:
one or more memory devices; and
processing circuitry coupled with the one or more memory devices and configured to cause the memory system to:
receive temperature information associated with the one or more memory devices;
receive a refresh command at the one or more memory devices;
route a current from a driver to a set of one or more access lines in response to the refresh command; and
activate, based at least in part on routing the current, the set of one or more access lines as part of one or more refresh operations, wherein a count indicative of a quantity of access lines in the set of one or more access lines is based at least in part on the temperature information.

16. The memory system of claim 15, wherein the processing circuitry is further configured to cause the memory system to:
compare a value in the temperature information to a temperature threshold; and
determine the count indicative of the quantity of access lines in the set of one or more access lines based at least in part on comparing the value in the temperature information to the temperature threshold, wherein activating the set of one or more access lines is based at least in part on determining the count.

17. The memory system of claim 16, wherein the processing circuitry is further configured to cause the memory system to:
compare the value in the temperature information to a second temperature threshold, wherein the count indicative of the quantity of access lines in the set of one or more access lines is further based at least in part on comparing the value in the temperature information to the second temperature threshold.

18. The memory system of claim 17, wherein:
the temperature threshold corresponds to a first temperature; and
the second temperature threshold corresponds to a second temperature that is greater or less than the first temperature.

19. The memory system of claim 15, wherein the processing circuitry is further configured to cause the memory system to:
receive an activation command at the one or more memory devices; and
activate, in response to the activation command, a second set of one or more access lines, wherein a second count indicative of a second quantity of access lines in the second set of one or more access lines is based at least in part on the temperature information.

20. The memory system of claim 15, wherein the processing circuitry is further configured to cause the memory system to:
receive, after activating the set of one or more access lines, second temperature information associated with the one or more memory devices;
receive a second refresh command at the one or more memory devices; and
activate, in response to the second refresh command, a second set of one or more access lines, wherein a second count indicative of a second quantity of access lines in the second set of one or more access lines is based at least in part on the second temperature information.

21. The memory system of claim 20, wherein the set of one or more access lines and the second set of one or more access lines are activated according to a same activation periodicity.

22. A memory system, comprising:
one or more memory devices; and
processing circuitry coupled with the one or more memory devices and configured to cause the memory system to:
receive temperature information associated with the one or more memory devices;
receive a refresh command at the one or more memory devices;

activate, in response to the refresh command, a set of one or more access lines as part of one or more refresh operations, wherein a count indicative of a quantity of access lines in the set of one or more access lines is based at least in part on the temperature information; and access a set of one or more rows of memory cells within a memory array based at least in part on activating the set of one or more access lines, wherein each row of the set of one or more rows is coupled with a respective access line of the set of one or more access lines.

23. A memory system, comprising:

processing circuitry configured to receive a refresh command at one or more memory devices;

a temperature component coupled with the processing circuitry and configured to provide temperature information associated with the one or more memory devices; and a driver coupled with the processing circuitry and configured to:
  route a current from a driver to a set of one or more access lines in response to the refresh command; and
  activate, based at least in part on routing the current, the set of one or more access lines as part of one or more refresh operations, wherein a count indicative of a quantity of access lines in the set of one or more access lines is based at least in part on the temperature information from the temperature component.

* * * * *